United States Patent [19]

Charkoudian

[11] Patent Number: 5,883,150
[45] Date of Patent: Mar. 16, 1999

[54] COMPOSITIONS OF A COPOLYMER INCLUDING A SULFONE POLYMER

[75] Inventor: John Charkoudian, Carlisle, Mass.

[73] Assignee: Millipore Corporation, Bedford, Mass.

[21] Appl. No.: 696,407

[22] Filed: Aug. 9, 1996

[51] Int. Cl.$^6$ .......................... C08L 81/06; C08F 283/00
[52] U.S. Cl. ...................... 522/136; 522/135; 522/144; 525/534; 525/535; 525/536; 525/537
[58] Field of Search ...................... 525/535, 536, 525/537, 534; 522/135, 136, 144

[56] References Cited

U.S. PATENT DOCUMENTS

| | | | |
|---|---|---|---|
| 5,021,523 | 6/1991 | Iizuka et al. | 525/537 |
| 5,174,958 | 12/1992 | Dickinson et al. | 422/26 |
| 5,612,425 | 3/1997 | Weber | 525/419 |
| 5,631,333 | 5/1997 | Weber et al. | 525/535 |
| 5,643,968 | 7/1997 | Andreola et al. | 525/535 |

FOREIGN PATENT DOCUMENTS 57-192415  5/1981  Japan .

*Primary Examiner*—David Buttner
*Attorney, Agent, or Firm*—John Dana Hubbard; Timothy J. King; Paul J. Cook

[57] ABSTRACT

A polysulfone composition is formed from a solution of a polysulfone and a free radical polymerizable monomer exposed to ultraviolet light to form a blend of the polysulfone and copolymers of activated polysulfone and polymerized monomer having polymer segments covalently bonded to each other. The blend is separated from solvent of the solution to form a solid comprising the blend throughout its bulk matrix.

17 Claims, No Drawings

COMPOSITIONS OF A COPOLYMER INCLUDING A SULFONE POLYMER

BACKGROUND OF THE INVENTION

This invention relates to polysulfone copolymer compositions having polymer segments covalently bonded and to a process for producing the polysulfone copolymer compositions. More particularly, this invention relates to polysulfone copolymer compositions wherein the copolymer is present throughout the solid bulk material of the composition. Sulfone polymers, such as polysulfone, polyethersulfone and polyphenylsulfone are tough amorphous polymers which are useful in a wide variety of applications including molded products, printed circuit wiring board substrates and in environments where resistance to caustic or acid is desirable. It would be desirable to modify the bulk properties of polysulfones, including chemical properties and physical properties to permit additional applications for the modified sulfone polymer.

At the present time, polysulfone grafted membranes have been prepared by modifying the surface of a solid polysulfone membrane with a polymerizable monomer to form a graft only on the membrane pore surface. The remaining portion of the membrane comprises unmodified polysulfone polymer. U.S. Pat. No. 5,468,390; Journal of Membrane Science, 105(1995), p. 237–247 and Journal of Membrane Science, 105 (1995, p. 249–259) disclose modified aryl polysulfone membranes having a hydrophilic vinyl monomer chemically grafted to their surfaces. An unmodified membrane is contacted with a solution of the monomer and is exposed to ultraviolet light to effect photochemical grafting in the absence of a sensitizer or a free radical initiator. The monomers utilized function to render only the polysulfone membrane surface hydrophilic. The remaining portion of the membrane bulk matrix comprise unmodified polysulfone. These modified membranes are not rewettable after they have been dried and, if dried, lose significant permeability. Therefore it is necessary to maintain the membrane surfaces wet prior to use. Japanese Pat. No. JP-A-2-59029, published Feb. 28, 1990, discloses a process for modifying a polysulfone porous membrane on its surface only with a polymerizable monomer by immersing the membrane in the monomer solution and irradiating the solution with ultraviolet light. The process is conducted under conditions such that any solvent used in the process does not dissolve the polysulfone membrane. As a result of the process, only the surface of the porous membrane is modified to render it hydrophilic when hydrophilic polymerizable monomers are utilized in the process. As is the case with the modified polymers disclosed in U.S. Pat. No. 5,468,390, the modified membrane surfaces cannot be dried without a serious loss of permeability.

Accordingly, it would be desirable to provide modified polysulfone compositions which are modified throughout their bulk matrix. In addition, it would be desirable to provide a process for forming such compositions which can be used with a wide variety of polymerizable monomers to produce polysulfone copolymer compositions having polymer segments covalently bonded.

SUMMARY OF THE INVENTION

The present invention provides polysulfone copolymer compositions having polymer segments covalently bonded and having this composition throughout its bulk matrix. These compositions are produced from a composition which, in turn, is produced by a solution polymerization process. In the solution polymerization process, a solution of an ultraviolet light activateable polysulfone is dissolved in a solvent together with a dissolved polymerizable monomer. The polymerizable monomer is a free radical polymerizable monomer which is copolymerized with the ultraviolet light activated polysulfone.

The solution of the polysulfone and the polymerizable monomer is exposed to ultraviolet light to activate at least a portion of the polysulfone thereby forming radicals which then interact with the polymerizable monomer to form copolymers of the polysulfone and the polymerized monomer having polymer segments covalently bonded. A solid polysulfone composition comprises a blend of the unreacted polysulfone and the copolymer.

In an optional embodiment of this invention, the unreacted polysulfone and the copolymer can be separated such as by selective extraction in a solvent which is a solvent for either the polysulfone or the copolymer and not for the other of the polysulfone or the copolymer. A solid copolymer recovered from solution comprises a copolymer having polymer segments covalently bonded throughout its bulk matrix.

DESCRIPTION OF SPECIFIC EMBODIMENTS

In accordance with the present invention, a solution of a sulfone polymer and a free radical polymerizable monomer is formed with a solvent which dissolves both the polymer and the monomer. The solution then is exposed to ultraviolet light under an atmosphere which is non-reactive with the solution such as an inert gas or nitrogen. It is preferred to utilize a source of ultraviolet light having a wavelength between about 290 and about 400 nm in order to avoid degradation of the sulfone polymer. Upon exposure to the ultraviolet light, the sulfone polymer is activated to form polymeric subunits containing free radicals. The extent to which the free radicals are formed is dependent upon both the wavelength of the ultraviolet light and the time to which the solution is exposed to the ultraviolet light. However, exposure conditions are controlled so that at least a portion of the dissolved sulfone polymer is activated to form the free radicals. Generally, exposure of the solution to ultraviolet light is conducted between about 0.1 and about 600 seconds, preferably between about 2 and about 30 seconds. Upon being exposed to the ultraviolet light, the sulfone polymer free radicals and the monomers interact to form copolymers comprised of polymer segments of the activated sulfone polymer and the polymerized monomer covalently bonded. The reaction product comprises a blend of unreacted sulfone polymer together with copolymers of the activated sulfone polymer and the polymerized monomer formed of polymer segments covalently bonded.

Sulfone polymers which are degraded by ultraviolet light and are useful in the present invention can be represented by the general formula for poly (arylsulfones):

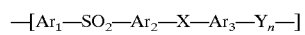

where: $Ar_1$ and $Ar_2$ may be the same or different and are: 1,4-phenylene, 1,3-phenylene, 1,2-phenylene, 4,4'-biphenylene, 1,4-naphthylene, 3-chloro-1, or 4-phenylene, 4,4'-diphenylether.

X is oxygen, sulfur, nitrogen or methylene.

Y is oxygen, sulfur, nitrogen or methylene.

$Ar_3$ can be the same or different than $Ar_1$ and $Ar_2$ as well or can be:

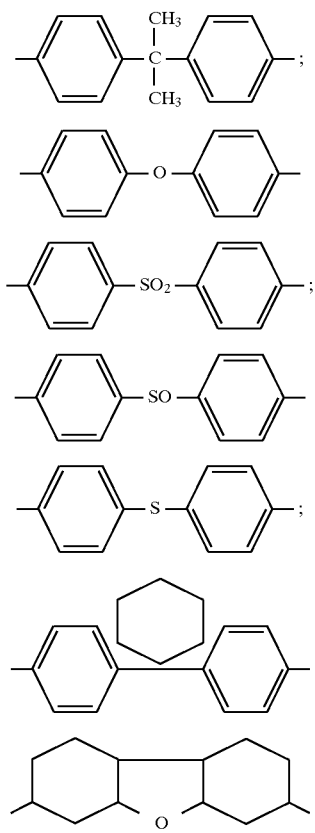

Representative suitable free radical polymerizable monomers include vinyl monomers such as water wettable monomers including 2-hydroxyethyl acrylate, 2-hydroxypropyl acrylate, 3-hydroxypropyl acrylate, 2-hydroxyethyl methacrylate, 2,3-dihydroxpropylacrylate, acrylamide, vinyl sulfonic acid, vinyl phosphoric acid, 4-styrenesulfonic acid, methacrylamide, N,N-dimethylacrylamide, $N,N^1$-methylenebisacrylamide, ethoxylated methalolpropaneacrylate, glycidyl acrylate, glycidyl methacrylate, N-methylolacrylamide, acrylic acid, methacrylic acid, methyl methacrylate, N-vinyl carbazole, N-vinyl pyrrolidone, dimethylaminomethacrylate, dimethylaminopropylmethacrylamide methacryloyloxyethyltremethylammonium chloride, or the like or mixtures thereof; hydrophobic monomers, including methyl acrylate, ethyl acrylate, perfluorooctylacrylate or the like.

Representative suitable solvents which can be utilized in the process of this invention to dissolve the sulfone polymer and the vinyl monomer include N-methylpyrrolidone, dimethyl-acetamide (DMAC), dimethylacrylamide (DMAD), dimethylsulfoxide or the like.

Upon removal of the solvent, the solid polymeric product recovered comprises a blend, throughout its bulk matrix of unreacted sulfone polymer and copolymers produced by free radical polymerization of the activated sulfone polymer and the polymerized monomer which have polymer segments covalently bonded. Thus, the products of this invention differ from prior art copolymer compositions wherein a copolymer is formed solely on the surface of a solid sulfone polymer which surface has been modified with a polymerizable monomer under conditions to effect grafting of a polymerizable monomer with the polysulfone.

In one embodiment of this invention, the unreacted polysulfone and the copolymer are separated. Separation of the unreacted polysulfone from the copolymer composition is conveniently effected by selective extraction. The copolymer and unreacted polysulfone are contacted with a solvent which selectively dissolves either the polysulfone or the copolymer composition but not the other of the polysulfone or the copolymer composition. The copolymer composition, either in solution or as a solid is recovered. If solid, a solution of the copolymer is formed. The copolymer solution then is subjected to phase separation in the manner set forth above.

Exemplary suitable solvents are methylene chloride, for polysulfone, polyethersulfone or polyphenylsulfone while not dissolving polyacrylic acid-polysulfone copolymer . Acetone selectively dissolves poly $N,N^1$-dimethylacrylamide-polysulfone copolymer while not dissolving polyethersulfone. The following examples illustrate the present invention and are not intended to limit the same.

EXAMPLE 1

A polyethersulfone solution is prepared by dissolving 8.34 grams of Amoco Radel A200 polyethersulfone (PES) in 33.4 grams of N-methylpyrrolidone (NMP), (20% PES). To this solution is added 3.5 grams of neat acrylic acid (AA), and the mixture is mixed until the AA is totally dissolved. The monomer/polymer NMP solution is spread out as a thin film using a stainless steel roller with a three mil gap onto a borosilicate glass plate which is 1/16 th thick. The film is covered with another plate of the same type glass fitted with silicone gaskets to prevent contact of the solution with the top plate. This entire assembly is transported through. Fusions Systems UV exposure unit having H bulbs positioned above and below the conveyance chamber of the system at a line speed of 10 feet per minute.

The glass plates filter out shorter wavelength ultraviolet light and prevent excessive UV photochemical degradation of the PES. Another beneficial modification of the above procedure is to replace the ambient atmosphere above the film of solution with an argon atmosphere. This will result in a higher yield of the block copolymer of PES and monomer.

After UV exposure, the product polymer solution is precipitated by contact with a large volume of deionized water. Typically the top plate is removed and the polymer solution containing both unreacted PES and copolymers of PES is immersed in a water bath. The polymer blend is allowed to dry in air and then in an oven to remove all water.

3.1 grams of the polymer blend is treated with 75 grams of methylene chloride (MC), which is an excellent solvent for PES. The copolymers of PES and the polymerized monomer are insoluble in MC. The mixture is centrifuged and the block copolymers are collected while the unreacted PES in solution is disposed of as chlorinated waste. The copolymers are dispersed in 20 grams of fresh MC, centrifuged and separated as above. This washing procedure was repeated three times. Drying this product gives 0.398 grams of polyacrylic acid—PES copolymer, which is about a 12.85 yield. As pointed out above, this yield can be significantly enhanced by using an inert atmosphere such as argon or nitrogen gas.

This product is soluble NMP, but insoluble in water heated to 95° C. Polyacrylic acid is soluble in both NMP and water at 25° C. The infrared spectrum of the starting PES shows no carbonyl absorption. The blend of the unmodified PES and the PES copolymer displays a prominent carbonyl absorption at 1750 $cm^{-1}$. The carbonyl absorption achieves its maximum intensity in the purified copolymer.

EXAMPLE 2

The procedure of this example was identical to that used to produce polyacrylic acid-PES in Example 1 but substituting dimethylaminopropylmethacrylamide for the acrylic acid. Isolation of the block copolymer in 10% yield gave a product insoluble in MC with an infrared spectrum having strong features of both dimethylaminopropylmethacrylamide and PES.

EXAMPLE 3

A polyethersulfone solution was prepared by dissolving 3.0 grams of Amoco Radel A200 polyethersulfone (PES) in 12.0 grams of N-methylpyrollidone. To this is added 1.5 grams $N,N^1$-dimethylacrylamide (DMAD). The mixture was stirred until total dissolution of the DMAD is achieved.

The UV exposure was identical to that of Example 1 except that the conveyance speed was 7.5 feet per minute. The precipitation procedure was identical to that of Example 1.

In contrast to Examples 1 and 2 where a solvent for unreacted PES was used to treat the PES/grafted PES mixture leaving the grafted product undissolved, the isolation procedure employed in this example utilizes a solvent for the grafted product leaving the ungrafted PES undissolved.

Isolation method 1

1

216 milligrams of the dried polymer mixture was treated with 10.0 grams of acetone and the mixture was stirred for 30 minutes at 50° C. Acetone is not a solvent for PES at this temperature. Isolation and drying of the solid gave a weight loss of 6.8%. This solid displayed a 35% lower DMAD carbonyl absorption while the dried product from the acetone extraction product had a DMAD carbonyl absorption that was enhanced by 35%. These measurements show that acetone separates the PES copolymer from the unreacted PES polymer.

Isolation Method 2

330 milligrams of the dried polymer mixture was treated with 50.0 grams of boiling isopropyl alcohol for 2 hours. Boiling isopropyl alcohol is not a solvent for PES. Isolation and drying of solid gave a weight loss of 8.3% and the DMAD carbonyl absorption was lower by 34% relative to the starting mixture. The residue isolated by drying the extract displayed a 30% more intense DMAD carbonyl absorption. Therefore, boiling isopropyl alcohol is a solvent for the DMAD-PES copolymer, thus separating it from the unreacted PES.

I claim:

1. A sulfone polymer composition comprising a blend throughout its solid bulk matrix of (a) a first sulfone polymer and (b) a copolymer of a second sulfone polymer derived from said first sulfone polymer by exposing said first sulfone polymer to ultraviolet light and a polymerized monomer composition said copolymer formed from a second sulfone polymer free radical initiated polymerization of said monomer composition resulting in a covalent bond between polymer units of said monomer and said second sulfone polymer.

2. The composition of claim 1 wherein said first sulfone polymer is selected from the group consisting of polyethersulfone, polysulfone, polyphenylsulfone and mixtures thereof.

3. The composition of claim 1 wherein said monomer composition is selected from the group consisting of acrylic acid and N, $N^1$ dimethylacrylamide.

4. The process for forming, a sulfone polymer composition which comprises: (a) forming a solution of a first sulfone polymer and a free radical polymerizable monomer composition, (b) exposing said solution to ultraviolet light to activate said sulfone polymer to form second sulfone free radical containing moieties thereby initiating polymerization with said monomer composition to form a copolymer composition of said second sulfone polymer covalently bonded to a polymerized monomer composition having polymer segments and (c) removing solvent from said solution to form a solid blend of said first sulfone polymer and said copolymer throughout the bulk matrix of said sulfone polymer composition.

5. The process of claim 4 wherein said first sulfone polymer is selected from the group consisting of polyethersulfone, polysulfone, polyphenylsulfone and mixtures thereof.

6. The process of claim 4 wherein said monomer composition is acrylic acid.

7. The process of claim 4 wherein said monomer composition is N, $N^1$ dimethylacrylamide.

8. The process of claim 4 wherein said ultraviolet light has a wavelength of between about 290 nm and about 400 nm.

9. The process of claim 4 wherein said first sulfone polymer is separated from said copolymer subsequent to said step of exposing said solution to ultraviolet light and recovering said copolymer.

10. The process of claim 9 wherein said first sulfone polymer is selected from the group consisting of polyethersulfone, polysulfone, polyphenylsulfone and mixtures thereof.

11. The process of claim 9 wherein said monomer composition is selected from the group consisting of acrylic acid and N, $N^1$ dimethylacrylamide.

12. The process of claim 9 wherein said ultraviolet light has a wavelength of between about 290 nm and about 400 nm.

13. A sulfone polymer composition which is formed throughout its solid bulk matrix of a copolymer of (a) a second sulfone polymer derived from a first sulfone polymer by exposing said first sulfone polymer to ultraviolet light and (b) a free radical polymerized monomer composition having polymer segments, said second sulfone polymer being covalently bonded to said polymerized monomer composition.

14. The composition of claim 13 wherein said sulfone polymer is selected from the group consisting of polyethersulfone, polysulfone, polyphenylsulfone and mixtures thereof.

15. The composition of claim 13 wherein said monomer is selected from the group consisting of acrylic acid and N, $N^1$ dimethylacrylamide.

16. The composition of any one of claims 1, 2, 13 or 14 wherein said monomer composition is a mixture of monomers.

17. The process of any one of claims 4, 5, 9 or 10 wherein said monomer composition is a mixture of monomers.

* * * * *